United States Patent
Gevorgyan et al.

(10) Patent No.: US 7,679,461 B2
(45) Date of Patent: Mar. 16, 2010

(54) VARACTOR DEVICE WITH REDUCED TEMPERATURE DEPENDENCE

(75) Inventors: Spartak Gevorgyan, Gothenburg (SE); Harald Jacobsson, Vastra Frolunda (SE); Per Thomas Lewin, Onsala (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 376 days.

(21) Appl. No.: 11/577,063

(22) PCT Filed: Oct. 11, 2004

(86) PCT No.: PCT/SE2004/001443

§ 371 (c)(1),
(2), (4) Date: Apr. 11, 2007

(87) PCT Pub. No.: WO2006/041336

PCT Pub. Date: Apr. 20, 2006

(65) Prior Publication Data

US 2009/0027132 A1    Jan. 29, 2009

(51) Int. Cl.
*H03L 1/04* (2006.01)
(52) U.S. Cl. ................ 331/66; 331/177 V; 331/176; 334/6
(58) Field of Classification Search ............ 331/36 C, 331/177 V, 176, 66; 334/5, 6, 78
See application file for complete search history.

(56) References Cited

U.S. PATENT DOCUMENTS

| | | | | |
|---|---|---|---|---|
| 3,757,245 A | * | 9/1973 | Berger | 331/66 |
| 4,607,237 A | * | 8/1986 | Aota | 331/116 R |
| 2002/0149434 A1 | * | 10/2002 | Toncich et al. | 331/158 |

FOREIGN PATENT DOCUMENTS

WO    WO 02/084858 A1    10/2002

* cited by examiner

*Primary Examiner*—Robert Pascal
*Assistant Examiner*—Ryan J. Johnson
(74) *Attorney, Agent, or Firm*—Roger S. Burleigh

(57) ABSTRACT

The invention discloses a varactor device (100) for improved temperature stability, comprising a first varactor (160) connected to a decoupling network (150). The device further comprises a voltage stabilizer (110), said stabilizer comprising a capacitor (140) and a temperature dependent capacitor (130), and in that the stabilizer comprises means for connection to a DC-feed (120). Suitably, the decoupling network (150) is connected in parallel to the first varactor (160), and the capacitor (140) of the voltage stabilizer (110) is connected in parallel to the decoupling network (150), the temperature dependent capacitor (130) of the voltage stabilizer (110) being connected in series to the diode of the voltage stabilizer (110).

3 Claims, 5 Drawing Sheets

VARACTOR DEVICE WITH REDUCED TEMPERATURE DEPENDENCE

TECHNICAL FIELD

The present invention discloses a varactor device for improved temperature stability, comprising a first varactor connected to a decoupling network.

BACKGROUND ART

Tuneable microwave components such as varactors, phase shifters, delay lines etc. which are based on lumped element or distributed ferroelectric varactors usually suffer from large temperature dependence of their parameters due to inherent temperature dependence of the ferroelectric materials.

Naturally, this temperature dependence is undesired, since it will, inter alia, cause problems in the use of such components in various designs.

DISCLOSURE OF INVENTION

Thus, there is a need for a less temperature dependent varactor or varactor device than has hitherto been available.

This need is addressed by the present invention in that it discloses a varactor device for improved temperature stability, comprising a first varactor connected to a decoupling network. The device further comprises a voltage stabilizer, said stabilizer comprising a capacitor and a temperature dependent capacitor. In addition, the stabilizer comprises means for connection to a DC-feed.

BRIEF DESCRIPTION OF THE DRAWINGS

The invention will be described in more detail in the following detailed description, with reference to the appended drawings, in which.

EMBODIMENTS

Figure 1:
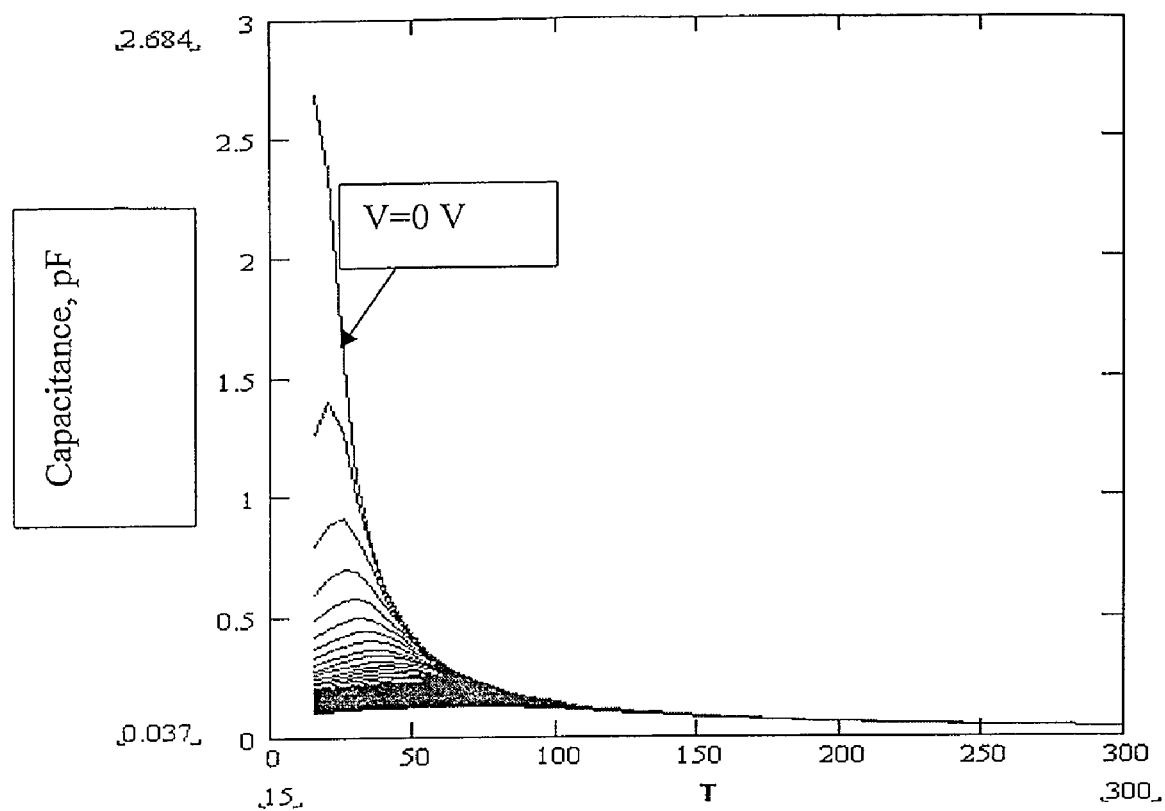
FIG. 1 shows the temperature dependency of a ferroelectric varactor.

In order to first illustrate the problem which the device of the invention is intended to solve, reference is made to FIG. 1 which shows the capacitance of a typical varactor as a function of the ambient temperature. Different curves are shown, each one representing a different bias voltage used with the varactor. The top curve in the diagram shows the capacitance of the varactor at a bias voltage of 0 volts.

As is apparent from FIG. 1, the temperature dependence of the varactor's capacitance is quite high. The aim of the present invention is to stabilise the capacitance of a varactor with respect to ambient temperature.

Figure 2:
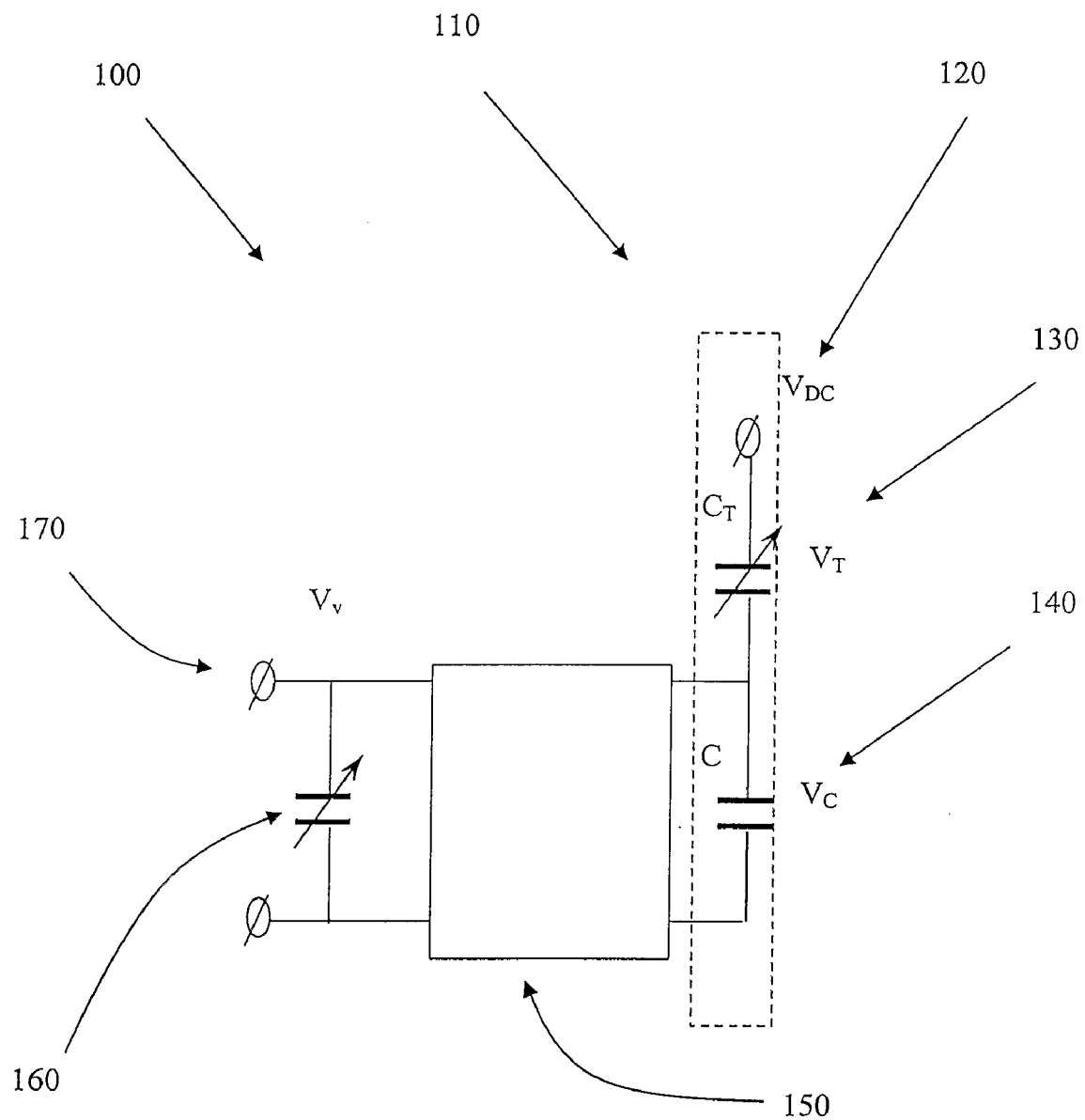
FIG. 2 shows a block diagram of a device according to the present invention.

FIG. 2 shows a block diagram of a device 100 which illustrates the principles behind the invention. As shown in FIG. 2, the device according to the invention comprises a first varactor 160, which it is intended to give stable temperature characteristics by means of the device 100.

Apart from the first varactor 160 and its output ports 170, the device 100 additionally comprises a decoupling network 150. One of the reasons for the decoupling network 150 is to shield the rest of the device 100 from signals which are applied to the first varactor 160, especially since the first varactor 160 is mainly intended to be used at high frequencies, usually microwave frequencies.

Figure 3:
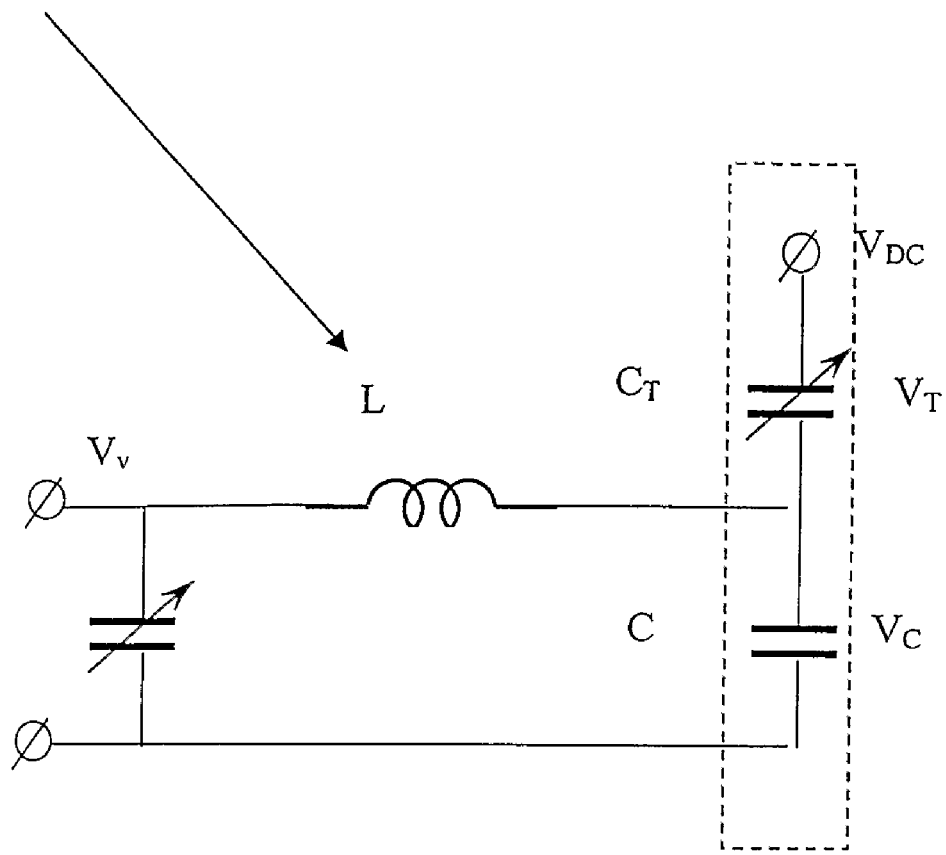
FIG. 3 shows a block diagram of a specific example of an embodiment of the invention.

Suitably, the decoupling network 150 is coupled in parallel to the varactor 160. FIG. 3 shows the device 100 of FIG. 2, but also shows an example of a decoupling network, in this case in the shape of a coil 155.

The decoupling network 150 could also, particularly for wide band operation, just be a resistor. Since no current will flow via the capacitors, no voltage drop will occur on such a resistor. For narrow band operation, the decoupling network 150 may be a parallel LC circuit with a resonant frequency corresponding to the frequency of operation of the first varactor 160.

The device 100 also comprises a voltage stabilizer 110, the function of which will become apparent in the following description. The voltage stabilizer 110 comprises input means 120 for a DC-voltage, a temperature dependent capacitor 130, and a capacitor 140.

As shown in FIG. 2, the capacitor 140 of the voltage stabilizer 110 is connected in parallel to the decoupling network 150, and the temperature dependent capacitor 130 of the voltage stabilizer 110 is connected in series to the capacitor 140.

In order to utilize the stabilising characteristics of the device 100, a DC-voltage $V_{DC}$ is applied to the DC-input means 120 of the stabilizer. This voltage $V_{DC}$ will be divided in a voltage $V_C$ over the capacitor 140 and a voltage $V_T$ over the temperature dependent capacitor 130. If the capacitance of the capacitor 140 is C and that of the temperature dependent capacitor 130 is $C_T$, the input DC-voltage $V_{DC}$ will divide as follows:

$$V_C = \frac{C_T}{C + C_T} V_{DC} \quad (1)$$

$$V_T = \frac{C}{C + C_T} V_{DC} \quad (2)$$

The temperature dependent capacitor 130 included in the voltage divider 110 is made of a similar, preferably the same, type of ferroelectric material as the first varactor 160, and thus preferably has a temperature dependent capacitance as that shown in FIG. 1, i.e. the same as the first varactor 160.

Consider now what will happen in the case of a capacitance increase in both the first varactor 160 and the temperature dependent capacitor 130 varactors caused by a change in ambient temperature:

Due to such a change in capacitances, a voltage redistribution takes place in the voltage divider 110, so that the voltage on the temperature dependent capacitor 130 decreases when its capacitance increases.

As follows from equations (1) and (2) above, the voltage $V_C$ over the capacitor 140 is $V_C = V_{DC} - V_T$. For a lossless decoupling network such as the one shown in FIG. 2, the voltage $V_V$ over the first varactor 160 is the same as the voltage $V_c$ over the capacitor 140, i.e. $V_v = V_C$, and thus $V_v = V_{DC} - V_T$.

A temperature dependent reduction in the capacitance of the first varactor 160 will cause a similar capacitance reduction in the voltage dependent capacitor 130. This capacitance reduction of the temperature dependent capacitor 130 will cause the stabilising voltage $V_{DC}$ to be redistributed, with a smaller voltage now being applied over the temperature dependent capacitor 130. Since the temperature dependent capacitor 130 is coupled in parallel to the decoupling network 150 and also to the first varactor 160, this means that the voltage applied from the stabilizer 120 to the first varactor 160 will drop.

As a result of the drop in voltage $V_C$ from the stabilizer 120 to the first varactor 160, the reduction of the first varactor's capacitance caused by temperature will be compensated by a reduced voltage $V_C$ and thus a reduction in $V_V$, leading to an increase in the first varactor's capacitance.

In a similar way, any temperature-caused capacitance increase of the first varactor 160 will be compensated by increased voltage $V_C$ leading to a corresponding change in the voltage $V_v$ over the first varactor.

In order to achieve the desired effect, i.e. corresponding variations in capacitance in the first varactor 160 and the diode 130, the temperature dependent capacitor 130 is suitably made of a similar, preferably the same, type of ferroelectric material as the first varactor 160, and is thus characterised by temperature dependent characteristics similar to the one shown in FIG. 3.

Figure 4:
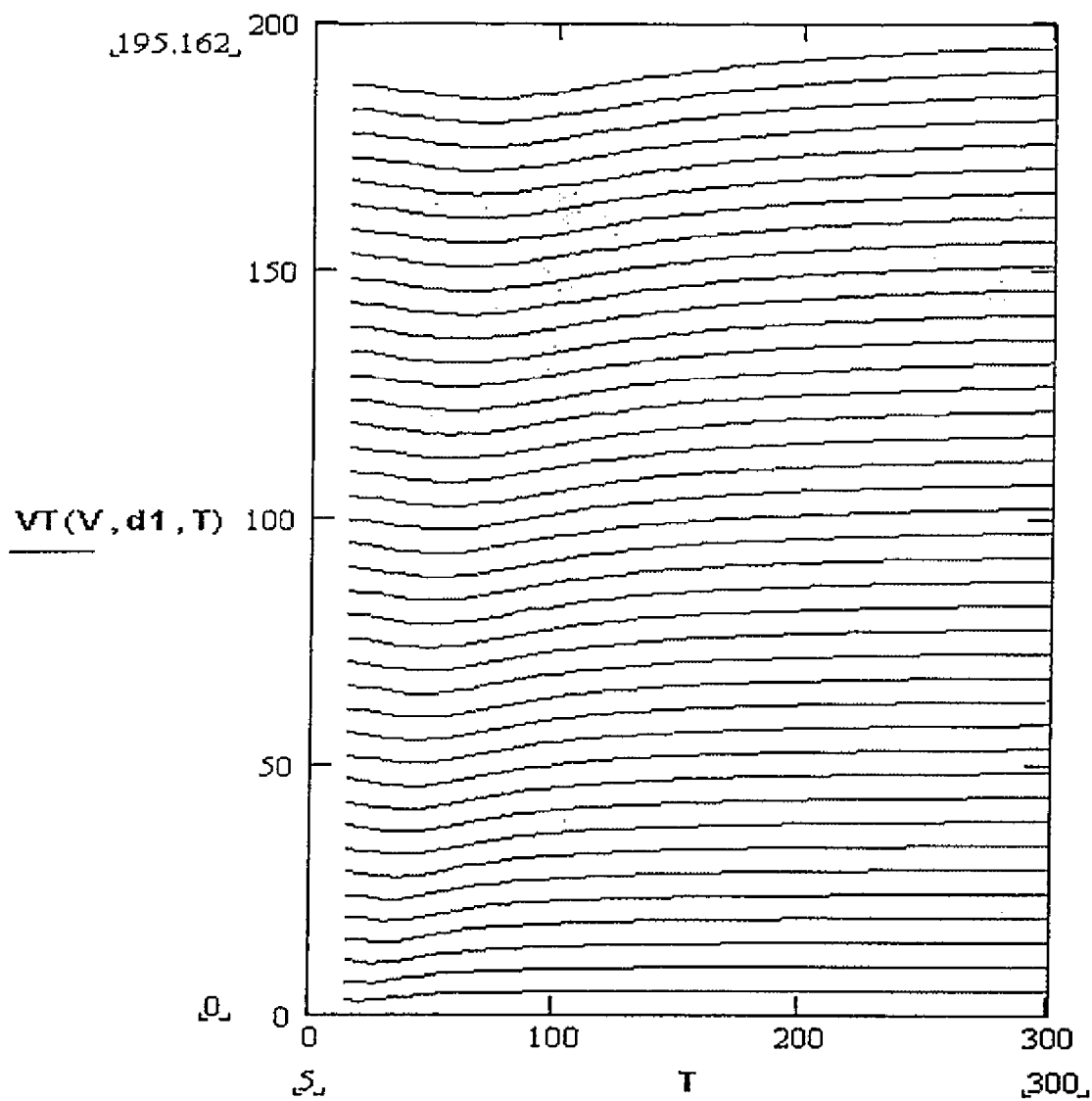
FIG. 4 shows the temperature dependent voltage drops over the capacitor $C_T$.

FIG. 4 shows how the voltage on the diode 130 decreases when its capacitance increases, caused by, for example, changes in the ambient temperature.

Figure 5:
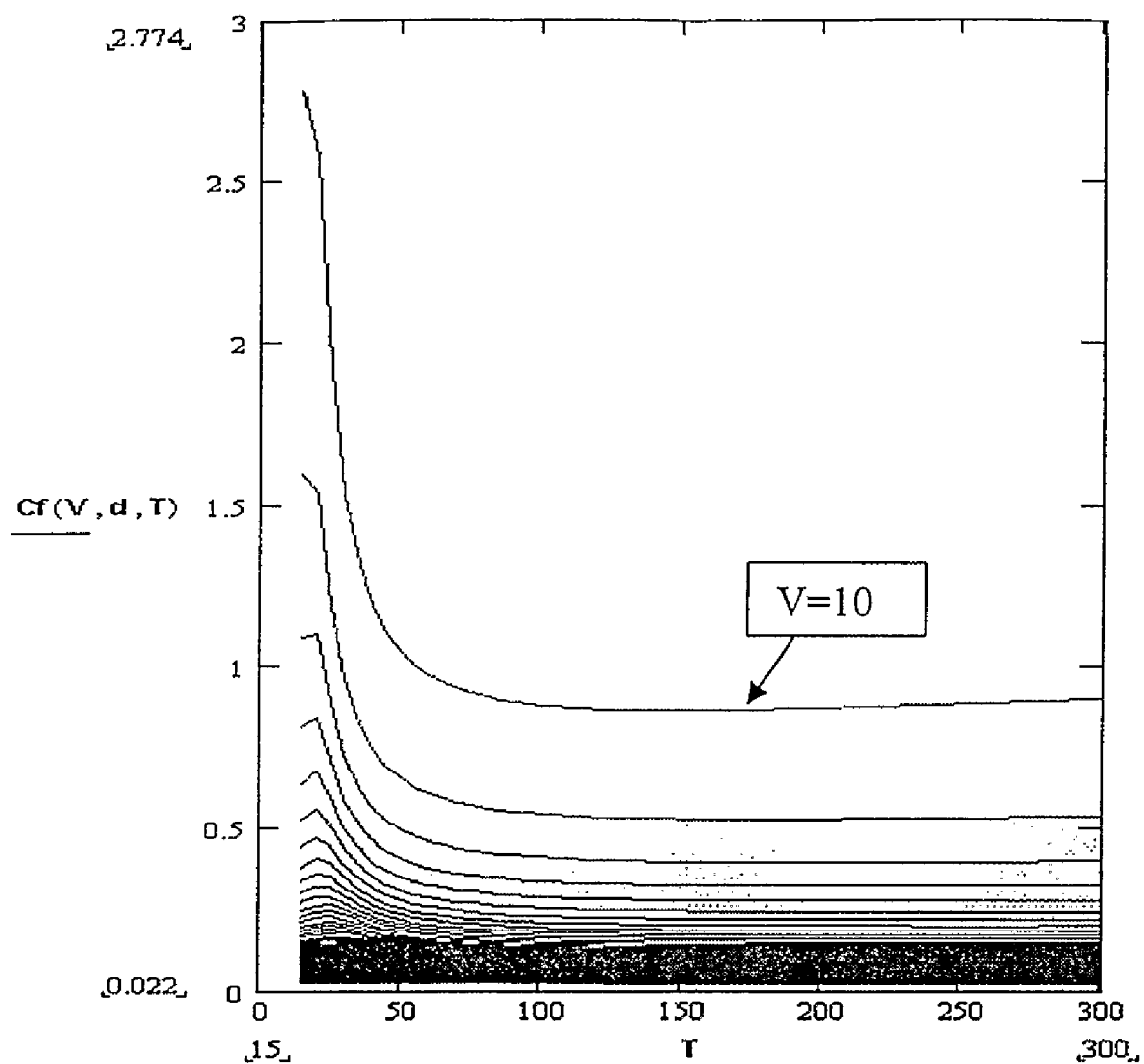
FIG. 5 shows the temperature dependency of a varactor device of the invention

FIG. 5 shows the temperature dependency of the first varactor 160 when it is used in a device 100 of the invention. As can be seen, the temperature dependency is greatly reduced by means of the invention.

The invention is not limited to the examples of embodiments shown above, but may be freely varied within the scope of the claims. For example, the temperature dependent capacitor 130 and the capacitor 140 may change places relative to that shown in FIGS. 2 and 3, if the temperature dependent capacitor 130 has an "opposite" temperature dependence, i.e. when the capacitance of the varactor 160 goes up, the capacitance of the temperature dependent capacitor 140 goes down.

Naturally, in the embodiments shown, it is a desire that the capacitor 140 is temperature independent.

The invention claimed is:

1. A temperature-stabilized varactor device, comprising:
   a varactor connected in parallel to a decoupling network, wherein said varactor is characterized by a capacitance that is a function of temperature and a bias voltage across said varactor; and,
   a voltage stabilizer comprising a capacitor coupled in parallel to said decoupling network and a temperature-dependent capacitor coupled in series to said capacitor;
   wherein, when a DC voltage is applied across said voltage stabilizer, the bias voltage across said varactor is altered in response to a change in the capacitance of said temperature-dependent capacitor, whereby the capacitance of said varactor is stabilized as a function of temperature.

2. The varactor device of claim 1, wherein the varactor and the temperature-dependent capacitor have essentially the same temperature dependency with regards to their capacitance.

3. The varactor device of claim 1, wherein the decoupling network comprises a coil coupled from a first terminal of said varactor to a coupling point between said temperature-dependent capacitor and a first terminal of said capacitor.

* * * * *

UNITED STATES PATENT AND TRADEMARK OFFICE
CERTIFICATE OF CORRECTION

PATENT NO. : 7,679,461 B2  Page 1 of 1
APPLICATION NO. : 11/577063
DATED : March 16, 2010
INVENTOR(S) : Gevorgyan et al.

It is certified that error appears in the above-identified patent and that said Letters Patent is hereby corrected as shown below:

On the title page, item (75), under "Inventors", in Column 1, Line 2, delete "Vastra Frolunda" and insert -- Västra Frölunda --, therefor.

Signed and Sealed this

Twenty-seventh Day of July, 2010

David J. Kappos
*Director of the United States Patent and Trademark Office*